United States Patent
Smithers et al.

(10) Patent No.: US 8,396,574 B2
(45) Date of Patent: Mar. 12, 2013

(54) AUDIO PROCESSING USING AUDITORY SCENE ANALYSIS AND SPECTRAL SKEWNESS

(75) Inventors: Michael Smithers, Kareela (AU); Alan Seefeldt, San Francisco, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 544 days.

(21) Appl. No.: 12/668,741

(22) PCT Filed: Jul. 11, 2008

(86) PCT No.: PCT/US2008/008592
§ 371 (c)(1),
(2), (4) Date: Jan. 12, 2010

(87) PCT Pub. No.: WO2009/011827
PCT Pub. Date: Jan. 22, 2009

(65) Prior Publication Data
US 2010/0198378 A1 Aug. 5, 2010

Related U.S. Application Data

(60) Provisional application No. 60/959,463, filed on Jul. 13, 2007.

(51) Int. Cl.
*G06F 17/00* (2006.01)
(52) U.S. Cl. .......................................... 700/94
(58) Field of Classification Search .................... 700/94; 704/500–504
See application file for complete search history.

(56) References Cited

U.S. PATENT DOCUMENTS

| | | | |
|---|---|---|---|
| 2,808,475 | A | 10/1957 | Stryker |
| 4,281,218 | A | 7/1981 | Chuang et al. |
| 4,543,537 | A | 9/1985 | Kuhn et al. |
| 4,624,009 | A | 11/1986 | Glenn |
| 4,739,514 | A | 4/1988 | Short et al. |
| 4,887,299 | A | 12/1989 | Cummins et al. |
| 5,027,410 | A | 6/1991 | Williamson et al. |
| 5,097,510 | A | 3/1992 | Graupe |
| 5,172,358 | A | 12/1992 | Kimura |

(Continued)

FOREIGN PATENT DOCUMENTS

| | | |
|---|---|---|
| DE | 4335739 | 5/1995 |
| DE | 19509149 | 9/1996 |

(Continued)

OTHER PUBLICATIONS

Intl Searching Authority, Communication Under Rule 51(4) EPC, European Patent Office, EP Application No. 03791982.2-2218, dated Dec. 5, 2005.

(Continued)

*Primary Examiner* — Andrew C Flanders

(57) ABSTRACT

A method for controlling the loudness of auditory events in an audio signal. In an embodiment, the method includes weighting the auditory events (an auditory event having a spectrum and a loudness), using skewness in the spectra and controlling loudness of the auditory events, using the weights. Various embodiments of the invention are as follows: The weighting being proportionate to the measure of skewness in the spectra; the measure of skewness is a measure of smoothed skewness; the weighting is insensitive to amplitude of the audio signal; the weighting is insensitive to power; the weighting is insensitive to loudness; and any relationship between signal measure and absolute reproduction level is not known at the time of weighting; the weighting includes weighting auditory-event-boundary importance, using skewness in the spectra.

10 Claims, 3 Drawing Sheets

U.S. PATENT DOCUMENTS

| | | | |
|---|---|---|---|
| 5,278,912 A | 1/1994 | Waldhauer | |
| 5,363,147 A | 11/1994 | Joseph et al. | |
| 5,369,711 A | 11/1994 | Williamson, III | |
| 5,457,769 A | 10/1995 | Valley | |
| 5,500,902 A | 3/1996 | Stockham, Jr. et al. | |
| 5,530,760 A | 6/1996 | Paisley | |
| 5,548,538 A | 8/1996 | Yamaguchi et al. | |
| 5,583,962 A | 12/1996 | Davis et al. | |
| 5,615,270 A | 3/1997 | Miller et al. | |
| 5,632,005 A | 5/1997 | Davis et al. | |
| 5,633,981 A | 5/1997 | Davis | |
| 5,649,060 A | 7/1997 | Ellozy et al. | |
| 5,663,727 A | 9/1997 | Vokac | |
| 5,682,463 A | 10/1997 | Allen | |
| 5,712,954 A | 1/1998 | Dezonno | |
| 5,724,433 A | 3/1998 | Engebretson et al. | |
| 5,727,119 A | 3/1998 | Davidson et al. | |
| 5,819,247 A | 10/1998 | Freund et al. | |
| 5,848,171 A | 12/1998 | Stockham, Jr. et al. | |
| 5,862,228 A | 1/1999 | Davis | |
| 5,878,391 A | 3/1999 | Aarts | |
| 5,907,622 A | 5/1999 | Dougherty | |
| 5,909,664 A | 6/1999 | Davis et al. | |
| 6,002,776 A | 12/1999 | Bhadkamkar et al. | |
| 6,002,966 A | 12/1999 | Loeb et al. | |
| 6,021,386 A | 2/2000 | Davis et al. | |
| 6,041,295 A | 3/2000 | Hinderks | |
| 6,061,647 A | 5/2000 | Barrett | |
| 6,088,461 A | 7/2000 | Lin et al. | |
| 6,094,489 A | 7/2000 | Ishige et al. | |
| 6,108,431 A | 8/2000 | Bachler | |
| 6,125,343 A | 9/2000 | Schuster | |
| 6,148,085 A | 11/2000 | Jung | |
| 6,182,033 B1 | 1/2001 | Accardi et al. | |
| 6,185,309 B1 | 2/2001 | Attias | |
| 6,233,554 B1 | 5/2001 | Heimbigner et al. | |
| 6,240,388 B1 | 5/2001 | Fukuchi | |
| 6,263,371 B1 | 7/2001 | Geagan, III et al. | |
| 6,272,360 B1 | 8/2001 | Yamaguchi et al. | |
| 6,275,795 B1 | 8/2001 | Tzirkel-Hancock et al. | |
| 6,298,139 B1 | 10/2001 | Poulsen et al. | |
| 6,301,555 B2 | 10/2001 | Hinderks | |
| 6,311,155 B1 | 10/2001 | Vaudrey et al. | |
| 6,314,396 B1 | 11/2001 | Monkowski | |
| 6,327,366 B1 | 12/2001 | Uvacek et al. | |
| 6,332,119 B1 | 12/2001 | Hinderks | |
| 6,351,731 B1 | 2/2002 | Anderson et al. | |
| 6,351,733 B1 | 2/2002 | Saunders et al. | |
| 6,353,671 B1 | 3/2002 | Kandel et al. | |
| 6,370,255 B1 | 4/2002 | Schaub et al. | |
| 6,411,927 B1 | 6/2002 | Morin et al. | |
| 6,430,533 B1 | 8/2002 | Kolluru et al. | |
| 6,442,278 B1 | 8/2002 | Vaudrey et al. | |
| 6,442,281 B2 | 8/2002 | Sato et al. | |
| 6,473,731 B2 | 10/2002 | Hinderks | |
| 6,498,855 B1 | 12/2002 | Kokkosoulis et al. | |
| 6,529,605 B1 | 3/2003 | Christoph | |
| 6,570,991 B1 | 5/2003 | Sheirer | |
| 6,625,433 B1 | 9/2003 | Poirier et al. | |
| 6,639,989 B1 | 10/2003 | Zacharov et al. | |
| 6,650,755 B2 | 11/2003 | Vaudrey et al. | |
| 6,651,041 B1 | 11/2003 | Juric | |
| 6,700,982 B1 | 3/2004 | Geurts et al. | |
| 6,807,525 B1 | 10/2004 | Li et al. | |
| 6,823,303 B1 | 11/2004 | Su et al. | |
| 6,889,186 B1 | 5/2005 | Michaelis | |
| 6,985,594 B1 | 1/2006 | Vaudrey et al. | |
| 7,058,572 B1 | 6/2006 | Nemer | |
| 7,065,498 B1 | 6/2006 | Thomas et al. | |
| 7,068,723 B2 | 6/2006 | Foote et al. | |
| 7,155,385 B2 | 12/2006 | Berestesky et al. | |
| 7,171,272 B2 | 1/2007 | Blarney et al. | |
| 7,212,640 B2 | 5/2007 | Bizjak | |
| 7,454,331 B2 | 11/2008 | Vinton | |
| 2001/0027393 A1 | 10/2001 | Touimi et al. | |
| 2001/0038643 A1 | 11/2001 | McParland | |
| 2002/0013698 A1 | 1/2002 | Vaudrey et al. | |
| 2002/0040295 A1 | 4/2002 | Saunders et al. | |
| 2002/0076072 A1 | 6/2002 | Cornelisse | |
| 2002/0097882 A1 | 7/2002 | Greenberg et al. | |
| 2002/0146137 A1 | 10/2002 | Kuhnel et al. | |
| 2002/0147595 A1 | 10/2002 | Baumgarte | |
| 2003/0002683 A1 | 1/2003 | Vaudrey et al. | |
| 2003/0035549 A1 | 2/2003 | Bizjak et al. | |
| 2004/0024591 A1 | 2/2004 | Boillot et al. | |
| 2004/0037421 A1 | 2/2004 | Truman | |
| 2004/0042617 A1 | 3/2004 | Beerends et al. | |
| 2004/0044525 A1 | 3/2004 | Vinton et al. | |
| 2004/0076302 A1 | 4/2004 | Christoph | |
| 2004/0122662 A1 | 6/2004 | Crockett | |
| 2004/0148159 A1 | 7/2004 | Crockett | |
| 2004/0165730 A1 | 8/2004 | Crockett | |
| 2004/0172240 A1 | 9/2004 | Crockett | |
| 2004/0184537 A1 | 9/2004 | Geiger et al. | |
| 2004/0190740 A1 | 9/2004 | Chalupper et al. | |
| 2004/0213420 A1 | 10/2004 | Gundry | |
| 2005/0071154 A1 | 3/2005 | Etter | |
| 2006/0002572 A1 | 1/2006 | Smithers et al. | |
| 2006/0215852 A1 | 9/2006 | Troxel | |
| 2007/0291959 A1 | 12/2007 | Seefeldt | |

FOREIGN PATENT DOCUMENTS

| | | | |
|---|---|---|---|
| DE | 19848491 | | 4/2000 |
| EP | 0517233 | | 12/1992 |
| EP | 0637011 | | 2/1995 |
| EP | 0661905 | | 5/1995 |
| EP | 0746116 | | 12/1996 |
| EP | 1239269 | | 9/2002 |
| EP | 1251715 | | 10/2002 |
| EP | 1387487 | | 4/2004 |
| EP | 1736966 | | 7/2007 |
| FR | 2820573 | | 8/2002 |
| JP | H05-066795 | | 3/1993 |
| JP | 10074097 | | 3/1998 |
| JP | 2004-129187 | | 4/2004 |
| WO | 9827543 | | 6/1998 |
| WO | 0045379 | | 8/2000 |
| WO | 0078093 | | 12/2000 |
| WO | 0217678 | | 2/2002 |
| WO | 03090208 | | 10/2003 |
| WO | 2004019656 | | 3/2004 |
| WO | 2004016964 | | 5/2004 |
| WO | 2004073178 | | 8/2004 |
| WO | 2004111994 | A2 | 12/2004 |
| WO | 2005086139 | | 9/2005 |
| WO | 2005038579 | | 10/2005 |
| WO | 2005104360 | | 11/2005 |
| WO | 2006006977 | | 1/2006 |
| WO | 2006019719 | | 2/2006 |
| WO | 2006026161 | A2 | 3/2006 |
| WO | 2006047600 | A1 | 5/2006 |
| WO | 2006113047 | | 10/2006 |
| WO | 2007008313 | | 3/2007 |
| WO | 2007120452 | | 10/2007 |
| WO | 2007120453 | | 10/2007 |
| WO | 2007123608 | | 11/2007 |
| WO | 2007127023 | | 11/2007 |
| WO | 2007127023 | A1 | 11/2007 |
| WO | 2008051347 | | 5/2008 |
| WO | 2008057173 | | 5/2008 |
| WO | 2008085330 | | 7/2008 |
| WO | 2008115445 | | 9/2008 |
| WO | 2008156774 | | 12/2008 |

OTHER PUBLICATIONS

Notification of the First Office Action, Chinese Application No. 03819918.1, dated Mar. 30, 2007.

Response to Notification of the First Office Action, Chinese Application No. 03819918.1, dated Aug. 14, 2007.

Response to Office Action from the Israel Patent Office, Israel Patent Application No. 165,398, dated Dec. 29, 2008.

Official Letter from the Intellectual Property Bureau, Ministry of Economic Affairs, Taiwan, dated Mar. 21, 2008.

Response to Official Letter from the Intellectual Property Bureau, Ministry of Economic Affairs, Taiwan, dated Jun. 25, 2008.

Written Opinion of the Intellectual Property Office of Singapore, Singapore Application No. 0702926-7, dated May 12, 2008.

European Patent Office, Office Action dated Apr. 2, 2008, EP Application No. 05818505.9.

European Patent Office, Response to Office Action dated Apr. 2, 2008, EP Application No. 05818505.9.

Painter, Ted, et al., "Perceptual Coding of Digital Audio", Proceedings of the IEEE, vol. 88, No. 4, Apr. 2000.

Swanson, Mitchell D., et al., "Multiresolution Video Watermarking Using Perceptual Models and Scene Segmentation", Dept. of Electrical and Computer Engineering, University of Minnesota, IEEE 1997, pp. 558-561.

Todd, Craig C., et al., "AC-3: Flexible Perceptual Coding for Audio Transmission and Storage", pp. 1016, Feb. 1994.

EPO Intl Searching Authority, Notification of Transmittal of the International Search Report and the Written Opinion of the International Searching Authority, or the Declaration, PCT/US2008/008592, mailed Oct. 28, 2008.

Crockett, Brett et al., "A Method for Characterizing and Identifying Audio Based on Auditory Scene Analysis", Audio Engineering Society Convention 118 Paper 6416, May 2005.

Seefeldt, et al., "A New Objective Measure of Perceived Loudness", Audio Eng. Society Convention Paper 6236, San Francisco, CA Oct. 28, 2004, pp. 1-8.

Crockett, B., "High Quality Multichannel Time Sealing and Pitch-Shifting using Auditory Scene Analysis", Audio Eng. Society Convention Paper 5948, New York, Oct. 2003.

Chalupper, Josef, "Aural Exciter and Loudness Maximizer: What's Psychoacoustic about Psychoacoustic Processors?", Audio Eng. Society (AES) 108th Convention, Sep. 22-25, 2000, Los Angeles, CA, pp. 1-20.

Ghent, Jr., et al., "Expansion as a Sound Processing Tool in Hearing Aids", American Academy of Audiology Nat'l Convention, Apr. 29-May 2, 1999, Miami Beach, FL.

Ghent, Jr., et al., "Uses of Expansion to Promote Listening Comfort with Hearing Aids", American Academy of Audiology 12th Annual Convention, Mar. 16-19, 2000, Chicago, IL.

Martinez, G., Isaac, "Automatic Gain Control (AGC) Circuits—Theory and Design", University of Toronto ECE1352 Analog Integrated Circuits 1, Term Paper, Fall 2001, pp. 1-25.

Park, et al., "High Performance Digital Hearing Aid Processor with Psychoacoustic Loudness Correction", IEEE FAM p. 3, 1 0-7803-3734-4/97, pp. 312-313.

Bray, et al., "Optimized Target Matching: Demonstration of an Adaptive Nonlinear DSP System", Sonic Innovations, vol. 1, No. 2, 1998, pp. 1-4, presented at the American Academy of Audiology, Los Angeles, CA Apr. 4, 1998.

Bray, et al., "An Optimized Platform for DSP Hearing Aids", Sonic Innovations, vol. 1, No. 3, 1998, pp. 1-4, presented at the Conference on Advanced Signal Processing Hearing Aids, Cleveland, OH Aug. 1, 1998.

Bray, et al., "Digital Signal Processing (DSP) Derived from a Nonlinear Auditory Model", Sonic Innovations, vol. 1, No. 1, 1998, pp. 1-3, presented at American Academy of Audiology, Los Angeles, CA Apr. 4, 1998.

Ghent, Jr., et al., "Uses of Expansion to Promote Listening Comfort with Hearing Aids", Sonic Innovations, vol. 3, No. 2, 2000, pp. 1-4, presented at American Academy of Audiology 12th Annual Convention, Chicago, IL Mar. 16-19, 2000.

Nilsson, et al., "The Evolution of Multi-channel Compression Hearing Aids", Sonic Innovations, Presented at American Academy of Audiology 13th Convention, San Diego, CA Apr. 19-22, 2001.

Johns, et al., "An Advanced Graphic Equalizer Hearing Aid: Going Beyond Your Home Audio System", Sonic Innovations Corporation, Mar. 5, 2001, http://www.audiologyonline.com/articles/pf_arc_disp.asp?id=279.

Smith, et al., "Tandem-Free VoIP Conferencing: A Bridge to Next-Generation Networks", IEEE Communications Magazine, IEEE Service Center, New York, NY, vol. 41, No. 5, May 2003, pp. 136-145.

Scott, H.H., "The Amplifier and Its Place in the High Fidelity System", J. Audio Eng. Soc., vol. 1, No. 3, Jul. 1953.

Nigro, et al., "Concert-Hall Realism through the Use of Dynamic Level Control", J. Audio Eng. Soc., vol. 1, No. 1, Jan. 1953.

Newcomb, et al., "Practical Loudness: an Active Circuit Design Approach", J. Audio Eng. Soc., vol. 24, No. 1, Jan./Feb. 1976.

Robinson, et al., "Dynamic Range Control via Metadata", 107th Convention of the AES, Sep. 14-27, 1999, New York.

Watson, et al., "Signal Duration and Signal Frequency in Relation to Auditory Sensitivity", Journal of the Acoustical Society of America, vol. 46, No. 4 (Part 2) 1969, pp. 989-997.

ATSC Standard A52/A: Digital Audio Compression Standard (AC-3), Revision A, Advanced Television Systems Committee, Aug. 20, 2001. The A/52A document is available at http://www./atsc.org.standards.html.

Todd, et al., Flexible Perceptual Coding for Audio Transmission and Storage, 96th Convention of the Audio Engineering Society, Feb. 26, 1994, Preprint, 3796.

Davis, Mark, "The AC-3 Multichannel Coder", Audio Engineering Society, Preprint 3774, 95th AES Convention, Oct. 1993.

Bosi, et al., "High Quality, Low-Rate Audio Transform Coding for Transmission and Multimedia Applications", Audio Engineering Society Preprint 3365, 93rd AES Convention, Oct. 1992.

Fielder, et al., "Introduction to Dolby Digital Plus, An Enhancement to the Dolby Digital Coding System", AES Convention Paper 6196, 117th AES Convention, Oct. 28, 2004.

Truman, et al., "Efficient Bit Allocation, Quantization, and Coding in an Audio Distribution System", AES Preprint 5068, 107th AES Conference, Aug. 1999.

Fielder, et al., "Professional Audio Coder Optimized for Use with Video", AES Preprint 5033, 107th AES Conference, Aug. 1999.

Brandenburg, et al., "Overview of MPEG Audio: Current and Future Standards for Low-Bit-Rate Audio Coding", J. Audio Eng. Soc., vol. 45, No. 1/2, Jan./Feb. 1997.

Vernon, Steve, "Design and Implementation of AC-3 Coders", IEEE Trans. Consumer Electronics, vol. 41, No. 3, Aug. 1995.

Crockett, et al., "A Method for Characterizing and Identifying Audio Based on Auditory Scene Analysis", Audio Engineering Society Convention Paper 6416, 118th Convention Barcelona, May 28-31, 2005.

Crockett, Brett, "High Quality Multichannel Time Scaling and Pitch-Shifting Using Auditory Scene Analysis", Audio Engineering Society Convention Paper 5948, New York, Oct. 2003.

Hauenstein, M., "A Computationally Efficient Algorithm for Calculating Loudness Patterns of Narrowband Speech", Acoustics, Speech and Signal Processing 1997, 1997 IEEE Intl Conference, Munich, Germany, Apr. 21-24, 1997, Los Alamitos, CA USA, IEEE Comput. Soc., US, Apr. 21, 1997, pp. 1311-1314.

Cheng-Chieh, Lee, "Diversity Control Among Multiple Coders: A Simple Approach to Multiple Descriptions", Speech Coding 2000, Proceedings, 2000 IEEE Workshop on Digital Object Identifier: 10.1109/SCFT.2000.878399, pp. 69-71.

Moore, et al., "A Model for the Prediction of Thresholds, Loudness and Partial Loudness", Journal of the Audio Engineering Society, Audio Engineering Society, New York, vol. 45, No. 4, Apr. 1997, pp. 224-240.

Glasberg, et al., A Model of Loudness Applicable to Time-Varying Sounds, Journal of the Audio Engineering Society, Audio Engineering Society, New York, vol. 50, No. 5, May 2002, pp. 331-342.

Stevens, "Calculations of the Loudness of Complex Noise", Journal of the Accoustical Society of America, 1956.

Zwicker, "Psychological and Methodical Basis of Loudness", Acounstica, 1958.

Australian Broadcasting Authority (ABA), "Investigation into Loudness of Advertisements", Jul. 2002.

Bergman, Albert S., "Auditory Scene Analysis—The Perceptual Organization of Sound", Massachusetts Institute of Technology, 2001, Second MIT Press paperback.

Notification of the Second Office Action, The Patent Office of the People's Republic of China, Application No. 02808144.7, dated Dec. 9, 2005.

Notification of the First Office Action, The Patent Office of the People's Republic of China, Application No. 02808144.7, dated Apr. 22, 2005.

Reply to Request for Examination, Australian Patent Application No. 2002248431, dated Feb. 19, 2007.

Laroche, Jean, "Autocorrelation Method for High-Quality Time/Pitch-Scaling", Final Program and Paper Summaries, IEEE Workshop on New Paltz, NY, Oct. 17-20, 1993, pp. 131-134.

PCT/US02/04317 Notification of the Intl Search Report, dated Oct. 15, 2002.

U.S. Appl. No. 10/474,387, filed Oct. 7, 2003, Response to First Office Action dated Sep. 20, 2007.

U.S. Appl. No. 10/474,367, filed Oct. 7, 2003, First Office Action, dated Jul. 6, 2007.

Zwicker, et al., "Psychoacoustics—Facts and Models", Springer-Verlag, Chapter 8, Loudness, pp. 203-238, Berlin Heidelberg, 1990, 1999.

Lin, L., et al., "Auditory Filter Bank Design Using Masking Curves", 7th European Conference on Speech Communications and Technology, Sep. 2001.

ISO226: 1987 (E), "Acoustics—Normal Equal Loudness Level Contours".

Moulton, Dave, "Loud, Louder, Loudest!", Electronic Musician, Aug. 1, 2003.

Riedmiller, Jeff, "Working Toward Consistency in Program Loudness", Broadcast Engineering, Jan. 1, 2004.

Robinson, et al., "Time-Domain Auditory Model for the Assessment of High-Quality Coded Audio", 107th AES Convention, Sep. 1999.

Hermesand, et al., "Sound Design—Creating the Sound for Complex Systems and Virtual Objects", Chapter II, Anatomy and Psychoacoustics, 2003-2004.

Intl Searching Authority, "Notification of Transmittal of the Intl Search Report", PCT/US2006/011202, dated Aug. 9, 2006.

Written Opinion of the Intl Search Authority, PCT/US2006/011202, dated Aug. 9, 2006.

Carroll, Tim, "Audio Metada: You can get there from here", Oct. 11, 2004, pp. 1-4, XP002392570, http://tvtechnology.com/features/audio_notes/f-TC-metadata-08.21.02.shtml.

Trapee, W., et al.,"Key distribution for secure multimedia multicasts via data embedding", 2001 IEEE Intl Conference on Acoustics, Speech and Signal Processing, May 7-11, 2001.

Bertsekas, Dimitri P., "Nonlinear Programming", Gradient Methods—Convergence, Chapter 1.2, 1995, pp. 18-46.

Bertsekas, Dimitri P., "Nonlinear Programming", Nonderivative Methods,Chapter 1.9, 1995, pp. 142-148.

Moore, BCJ, "Use of a loudness model for hearing aid fitting", IV. Fitting hearing aids with multi-channel compression so as to restore "normal" loudness for speech at different levels, British Journal of Audiology, vol. 34, No. 3, Jun. 2000, pp. 165-177, Whurr Publishers, UK.

Saunders, "Real-Time Discrimination of Broadcast Speech/Music", Proc. of Intl Conf. on Acoustic Speech and Sig. Proce., 1996, pp. 993-996.

Bosi, et al., "ISO/IEC MPEG-2 Advanced Audio Coding", J. Audio Eng. Soc., vol. 45, No. 10, Oct. 1997, pp. 789-814.

Scheirer and Slaney, "Construction and Evaluation of a Robust Multifeature Speech/Music Discriminator", Proc. of Intl Conf. on Acoustic Speech and Sig. Proc., 1997, pp. 1331-1334.

Schapire, "A Brief Introduction to Boosting", Proc. of the 16th Intl Joint Conf. on Artificial Intelligence 1999.

ATSC, "Guide to the Use of the ATSC Digital Television Standard", Dec. 4, 2003.

ISO Standard, "Acoustics—Method for calculating loudness level", 532:1975, published 1975.

Belger, "The Loudness Balance of Audio Broadcast Programs", J. Audio Eng. Soc., vol. 17, No. 3, Jun. 1969, pp. 282-285.

Atkinson, I.A., et al., "Time Envelope LP Vocoder: A New Coding Technology at Very Low Bit Rates", 4th Ed., 1995 ISSN 1018-4074, pp. 241-244.

Mapes, Riordan, et al., Towards a Model of Loudness Recalibration, IEEE ASSP Workshop on New Paltz, Oct. 19-22, 1997 NY USA.

CEI/IEC Standard 60804 published Oct. 2000.

Blesser, Barry, "An Ultraminiature Console Compression System with Maximum User Flexibility", Journal of Audio Engineering Society, vol. 20, No. 4, May 1972, pp. 297-302.

Hoeg, W., et al., "Dynamic Range Control (DRC) and Music/Speech Control (MSC) Programme-Associated Data Services for DAB", EBU Review-Technical, European Broadcasting Union, Brussels, BE, No. 261, Sep. 21, 1994.

Soulodre, GA, "Evaluation of Objective Loudness Meters", Preprints of Papers Presented at the 116th AES Convention, Berlin, Germany, May 8, 2004.

Intl Searching Authority, Notification of Transmittal of the Intl Search Report, PCT/US2007/08313), dated Sep. 21, 2007.

Intl Searching Authority, "The Written Opinion of the Intl Searching Authority", PCT/US2007/08313, dated Sep. 21, 2007.

Intl Searching Authority, Notification of Transmittal of the Intl Search Report, PCT/US2007/007946, dated Aug. 21, 2007.

Intl Searching Authority, "The Written Opinion of the Intl Searching Authority", PCT/US2007/007946, dated Aug. 21, 2007.

Intl Searching Authority, Notification of Transmittal of the Intl Search Report, PCT/US2007/007945, dated Aug. 17, 2007.

Intl Searching Authority, "The Written Opinion of the Intl Searching Authority", PCT/US2007/007945, dated Aug. 17, 2007.

Intl Searching Authority, "Notification of Transmittal of the Intl Search Report", PCT/US2007/0025747, dated Apr. 14, 2008.

Intl Searching Authority, "The Written Opinion of the Intl Searching Authority", PCT/US2007/0025747, dated Apr. 14, 2008.

Intl Searching Authority, "Notification of Transmittal of the Intl Search Report", PCT/US2004/016964, dated Dec. 1, 2005.

Intl Searching Authority, "Written Opinion of the Intl Searching Authority", PCT/US2004/016964 dated Dec. 1, 2005.

Intl Searching Authority, "Notification of Transmittal of the Intl Search Report", PCT/US2006/010823, dated Jul. 25, 2006.

Intl Searching Authority, "Written Opinion of the Intl Searching Authority", PCT/US2006/010823 Jul. 25, 2006.

Intl Searching Authority, "Notification of Transmittal of the Intl Search Report", PCT/US2005/038579 dated Feb. 21, 2006.

Intl Searching Authority, "Written Opinion of the Intl Searching Authority", PCT/US2005/038579 dated Feb. 21, 2006.

Intl Searching Authority, "Notification of Transmittal of the Intl Search Report", PCT/US2007/022132 dated Apr. 18, 2008.

Intl Searching Authority, "Written Opinion of the Intl Searching Authority", PCT/US2007/022132 dated Apr. 18, 2008.

Intl Searching Authority, "Notification of Transmittal of the Intl Search Report", PCT/US2007/006444 dated Aug. 28, 2007.

Intl Searching Authority, "Written Opinion of the Intl Searching Authority", PCT/US2007/006444 dated Aug. 28, 2007.

Intl Searching Authority, "Notification of Transmittal of the Intl Search Report", PCT/US2008/007570 dated Sep. 10, 2008.

Intl Searching Authority, "Written Opinion of the Intl Searching Authority", PCT/US2008/007570, dated Sep. 10, 2008.

Intl Searching Authority, "Notification of Transmittal of the Intl Search Report", PCT/US2007/020747 dated May 21, 2008.

Mexican Patent Application No. PA/a/2005/002290 Response to Office Action dated Oct. 5, 2007.

ions, Barcelona, May 28-31, 2005;
AUDIO PROCESSING USING AUDITORY SCENE ANALYSIS AND SPECTRAL SKEWNESS

TECHNICAL FIELD

The invention relates to audio processing, in general, and to auditory scene analysis and spectral skewness, in particular.

REFERENCES AND INCORPORATION BY REFERENCE

The following documents are hereby incorporated by reference in their entirety:

Crockett and Seefeldt, International Application under the Patent Cooperation Treaty, S.N. PCT/US2007/008313, entitled, "Controlling Dynamic Gain Parameters of Audio using Auditory Scene Analysis and Specific-Loudness-Based Detection of Auditory Events," naming Brett Graham Crockett and Alan Jeffrey Seefeldt as inventors, filed March 30, 2007, and published on Nov. 8, 2007 as WO 2007/127023;

Seefeldt et al., International Application under the Patent Cooperation Treaty, S.N. PCT/US 2004/016964, entitled, "Method, Apparatus and Computer Program for Calculating and Adjusting the Perceived Loudness of an Audio Signal," naming Alan Jeffrey Seefeldt et al. as inventors, filed May 27, 2004, and published on Dec. 23, 2004 as WO 2004/111994 A2;

Seefeldt, International Application under the Patent Cooperation Treaty, S.N. PCT/US2005/038579, entitled "Calculating and Adjusting the Perceived Loudness and/or the Perceived Spectral Balance of an Audio Signal," naming Alan Jeffrey Seefeldt as the inventor, filed Oct. 25, 2005, and published on May 4, 2006 as WO 2006/047600;

Crockett, U.S. patent application Ser. No. 10/474,387, entitled, "High Quality Time-Scaling and Pitch-Scaling of Audio Signals," naming Brett Graham Crockett as the inventor, filed Oct. 10, 2003, and published on Jun. 24, 2004 as US 2004/0122662 A1;

Crockett et al., U.S. patent application Ser. No. 10/478, 398, entitled, "Method for Time Aligning Audio Signals Using Characterizations Based on Auditory Events," naming Brett G. Crockett et al. as inventors, filed Nov. 20, 2003, and published Jul. 29, 2004 as US 2004/0148159 A1;

Crockett, U.S. patent application Ser. No. 10/478,538, entitled, "Segmenting Audio Signals Into Auditory Events," naming Brett G. Crockett as the inventor, filed Nov. 20, 2003, and published Aug. 26, 2004 as US 2004/0165730 A1;

Crockett et al., U.S. patent application Ser. No. 10/478, 397, entitled, "Comparing Audio Using Characterizations Based on Auditory Events," naming Brett G. Crockett et al. as inventors, filed Nov. 20, 2003, and published Sep. 2, 2004 as US 2004/0172240 A1;

Smithers, International Application under the Patent Cooperation Treaty S.N. PCT/US 05/24630, entitled, "Method for Combining Audio Signals Using Auditory Scene Analysis," naming Michael John Smithers as the inventor, filed Jul. 13, 2005, and published Mar. 9, 2006 as WO 2006/026161;

Crockett, B. and Smithers, M., "A Method for Characterizing and Identifying Audio Based on Auditory Scene Analysis," Audio Engineering Society Convention Paper 6416, 118th Convention, Barcelona, May 28-31, 2005;

Crockett, B., "High Quality Multichannel Time Scaling and Pitch-Shifting using Auditory Scene Analysis," Audio Engineering Society Convention Paper 5948, New York, October 2003; and Seefeldt et al., "A New Objective Measure of Perceived Loudness," Audio Engineering Society Convention Paper 6236, San Francisco, Oct. 28, 2004.

BACKGROUND ART

Auditory Events and Auditory Event Detection

The division of sounds into units or segments perceived as separate and distinct is sometimes referred to as "auditory event analysis" or "auditory scene analysis" ("ASA"). The segments are sometimes referred to as "auditory events" or "audio events." Albert S. Bregman, "Auditory Scene Analysis—The Perceptual Organization of Sound" (Massachusetts Institute of Technology, 1991, Fourth printing, 2001, Second MIT Press paperback edition) extensively discusses auditory scene analysis. In addition, Bhadkamkar et al., U.S. Pat. No. 6,002,776 (Dec. 14, 1999) cites publications dating back to 1976 as "prior art work related to sound separation by auditory scene analysis." However, Bhadkamkar et al. discourages the practical use of auditory scene analysis, concluding that "[t]echniques involving auditory scene analysis, although interesting from a scientific point of view as models of human auditory processing, are currently far too computationally demanding and specialized to be considered practical techniques for sound separation until fundamental progress is made."

Crockett and Crocket et al. in the various patent applications and papers listed above identify auditory events. Those documents teach dividing an audio signal into auditory events (each tending to be perceived as separate and distinct) by detecting changes in spectral composition (amplitude as a function of frequency) with respect to time. This may be done, for example, by calculating the spectral content of successive time blocks of the audio signal, comparing the spectral content between successive time blocks and identifying an auditory event boundary as the boundary between blocks where the difference in the spectral content exceeds a threshold. Alternatively, changes in amplitude with respect to time may be calculated instead of or in addition to changes in spectral composition with respect to time.

The auditory event boundary markers are often arranged into a temporal control signal whereby the range, typically zero to one, indicates the strength of the event boundary. Furthermore this control signal is often filtered such that event boundary strength remains, and time intervals between the events boundaries are calculated as decaying values of the preceding event boundary. This filtered auditory event strength is then used by other audio processing methods including automatic gain control and dynamic range control.

Dynamics Processing of Audio

The techniques of automatic gain control (AGC) and dynamic range control (DRC) are well known and common in many audio signal paths. In an abstract sense, both techniques measure the level of an audio signal and then gain-modify the signal by an amount that is a function of the measured level. In a linear, 1:1 dynamics processing system, the input audio is not processed and the output audio signal ideally matches the input audio signal. Additionally, imagine an audio dynamics processing system that automatically measures the input signal and controls the output signal with that measurement. If the input signal rises in level by 6 dB and the processed output signal rises in level by only 3 dB, then the output signal has been compressed by a ratio of 2:1 with respect to the input signal.

In Crockett and Seefeldt, auditory scene analysis improves the performance of AGC and DRC methods by minimizing the change in gain between auditory event boundaries, and confining much of the gain change to the neighborhood of an event boundary. It does this by modifying the dynamics-processing release behavior. In this way, auditory events sound consistent and natural.

Notes played on a piano are an example. With conventional AGC or DRC methods, the gain applied to the audio signal increases during the tail of each note, causing each note to swell unnaturally. With auditory scene analysis, the AGC or DRC gain is held constant within each note and changes only near the onset of each note where an auditory event boundary is detected. The resulting gain-adjusted audio signal sounds natural as the tail of each note dies away.

Typical implementations of auditory scene analysis (as in the references above) are deliberately level invariant. That is, they detect auditory event boundaries regardless of absolute signal level. While level invariance is useful in many applications, some auditory scene analyses benefit from some level dependence.

One such case is the method described in Crockett and Seefeldt. There, ASA control of AGC and DRC prevents large gain changes between auditory event boundaries. However, longer-term gain changes can still be undesirable on some types of audio signals. When an audio signal goes from a louder to a quieter section, the AGC or DRC gain, constrained to change only near event boundaries, may allow the level of the processing audio signal to rise undesirably and unnaturally during the quiet section. This situation occurs frequently in films where sporadic dialog alternates with quiet background sounds. Because the quiet background audio signal also contains auditory events, the AGC or DRC gain is changed near those event boundaries, and the overall audio signal level rises.

Simply weighting the importance of auditory events by a measure of the audio signal level, power or loudness is undesirable. In many situations the relationship between the signal measure and absolute reproduction level is not known. Ideally, a measure discriminating or detecting perceptually quieter audio signals independent of the absolute level of the audio signal would be useful.

Here, "perceptually quieter" refers not to quieter on an objective loudness measure (as in Seefeldt et al. and Seefeldt) but rather quieter based on the expected loudness of the content. For example, human experience indicates that a whisper is a quiet sound. If a dynamics processing system measures this to be quiet and consequently increases the AGC gain to achieve some nominal output loudness or level, the resulting gain-adjusted whisper would be louder than experience says it should be.

DISCLOSURE OF THE INVENTION

Herein are taught methods and apparatus for controlling the loudness of auditory events in an audio signal. In an embodiment, the method includes weighting the auditory events (an auditory event having a spectrum and a loudness), using skewness in the spectra and controlling loudness of the auditory events, using the weights. Various embodiments of the invention are as follows: The weighting being proportionate to the measure of skewness in the spectra; the measure of skewness is a measure of smoothed skewness; the weighting is insensitive to amplitude of the audio signal; the weighting is insensitive to power; the weighting is insensitive to loudness; any relationship between signal measure and absolute reproduction level is not known at the time of weighting; the weighting includes weighting auditory-event-boundary importance, using skewness in the spectra; and reducing swelling of AGC or DRC processing level during perceptibly quieter segments of the audio signal as compared to methods not performing the claimed weighting.

In other embodiments, the invention is a computer-readable memory containing a computer program for performing any one of the above methods.

In still other embodiments, the invention is a computer system including a CPU, one of the above-mentioned memories and a bus communicatively coupling the CPU and the memory.

In still another embodiment, the invention is an audio-signal processor including a spectral-skewness calculator for calculating the spectral skewness in an audio signal, an auditory-events identifier for identifying and weighting auditory events in the audio signal, using the calculated spectral skewness, a parameters modifier for modifying parameters for controlling the loudness of auditory events in the audio signal and a controller for controlling the loudness of auditory events in the audio signal.

In still another embodiment, the invention is a method for controlling the loudness of auditory events in an audio signal, including calculating measures of skewness of spectra of successive auditory events of an audio signal, generating weights for the auditory events based on the measures of skewness, deriving a control signal from the weights and controlling the loudness of the auditory events using the control signal.

The various features of the present invention and its preferred embodiments may be better understood by referring to the following discussion and the accompanying drawings in which like reference numerals refer to like elements.

BEST MODE FOR CARRYING OUT THE INVENTION

Figure 1:
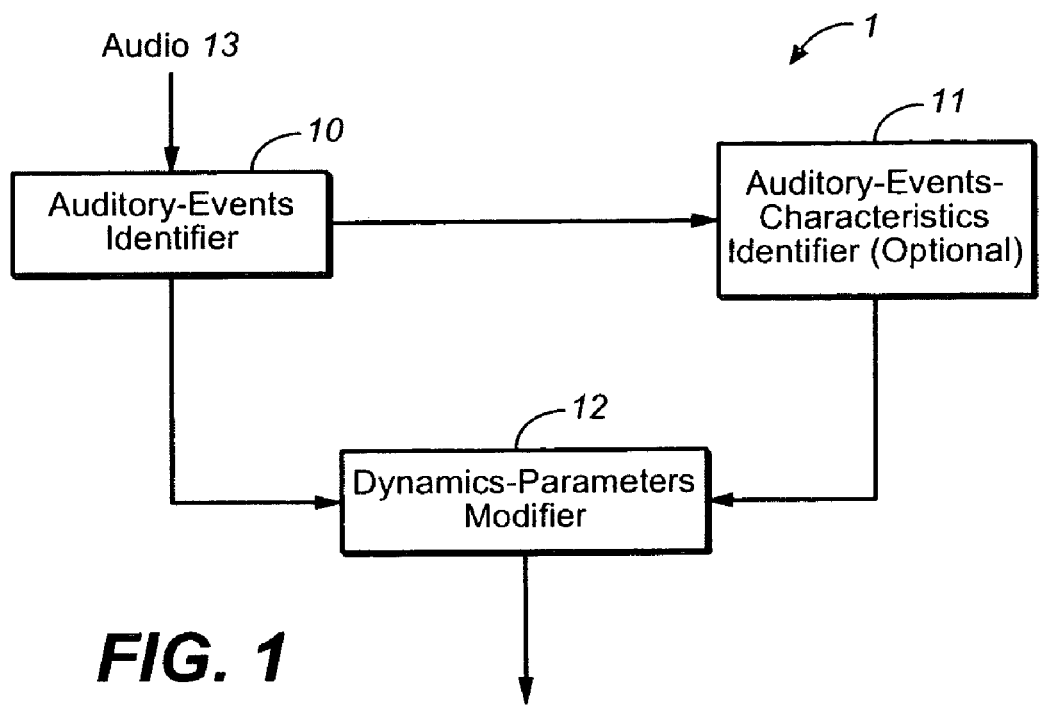
FIG. 1 illustrates a device for performing two Crockett and Seefeldt methods of analyzing auditory scenes and controlling dynamics-gain parameters.

FIG. 1 illustrates a device 1 for analyzing auditory scenes and controlling dynamics-gain parameters according to Crockett and Seefeldt. The device includes an auditory-events identifier 10, an optional auditory-events-characteristics identifier 11 and a dynamics-parameters modifier 12. The auditory events identifier 10 receives audio as input and produces an input for the dynamics-parameters modifier 12 (and an input for the auditory-events-characteristics identifier 11, if present). The dynamics-parameters modifier 12 receives output of the auditory-events identifier 10 (and auditory-events-characteristics identifier 11, if present) and produces an output.

The auditory-events identifier 10 analyzes the spectrum and from the results identifies the location of perceptible audio events that are to control the dynamics-gain parameters. Alternatively, the auditory-events identifier 10 transforms the audio into a perceptual-loudness domain (that may provide more psychoacoustically relevant information than the first method) and in the perceptual-loudness domain identifies the location of auditory events that are to control the dynamics-gain parameters. (In this alternative, the audio processing is aware of absolute acoustic-reproduction levels.)

The dynamics-parameters modifier 12 modifies the dynamics parameters based on the output of the auditory-events identifier 10 (and auditory-events-characteristics identifier 11, if present).

In both alternatives, a digital audio signal x[n] is segmented into blocks, and for each block t, D[t] represents the spectral difference between the current block and the previous block.

For the first alternative, D[t] is the sum, across all spectral coefficients, of the magnitude of the difference between normalized log spectral coefficients (in dB) for the current block t and the previous block t−1. In this alternative D[t] is proportional to absolute differences in spectra (itself in dB). For the second alternative, D[t] is the sum, across all specific-loudness coefficients, of the magnitude of the difference between normalized specific-loudness coefficients for the current block t and the previous block t−1. In this alternative, D[t] is proportional to absolute differences in specific loudness (in sone).

In both alternatives, if D[t] exceeds a threshold $D_{min}$, then an event is considered to have occurred. The event may have a strength, between zero and one, based on the ratio of D[t] minus $D_{min}$ to the difference between $D_{max}$ and $D_{min}$. The strength A[t] may be computed as:

$$A[t] = \begin{cases} 0 & D[t] \leq D_{min} \\ \frac{D[t] - D_{min}}{D_{max} - D_{min}} & D_{min} < D[t] < D_{max} \\ 1 & D[t] \geq D_{max} \end{cases} \quad (1)$$

The maximum and minimum limits are different for each alternative, due to their different units. The result, however, from both is an event strength in the range 0 to 1. Other alternatives may calculate an event strength, but the alternative expressed in equation (1) has proved itself in a number of areas, including controlling dynamics processing. Assigning a strength (proportional to the amount of spectral change associated with that event) to the auditory event allows greater control over the dynamics processing, compared to a binary event decision. Larger gain changes are acceptable during stronger events, and the signal in equation (1) allows such variable control.

The signal A[t] is an impulsive signal with an impulse occurring at the location of an event boundary. For the purposes of controlling the release time, one may further smooth the signal A[t] so that it decays smoothly to zero after the detection of an event boundary. The smoothed event control signal $\overline{A}[t]$ may be computed from A[t] according to:

$$\overline{A}[t] = \begin{cases} A[t] & A[t] > \alpha_{event}\overline{A}[t-1] \\ \alpha_{event}\overline{A}[t-1] & \text{otherwise} \end{cases} \quad (2)$$

Here $\alpha_{event}$ controls the decay time of the event control signal.

Figure 3:
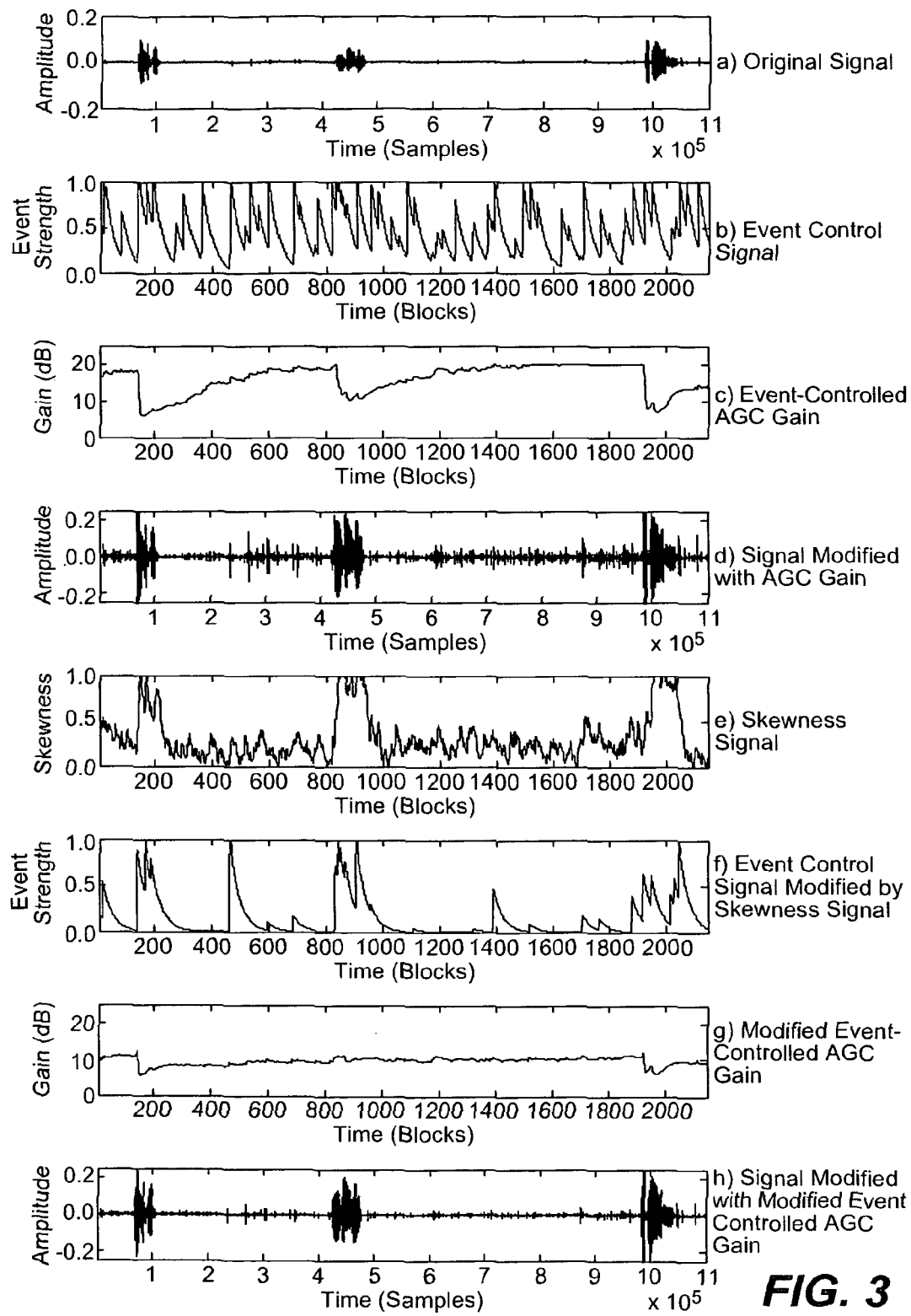
FIG. 3 is a series of graphs illustrating the use of auditory events to control the release time in a digital implementation of a Dynamic Range Controller (DRC), according to one embodiment of the invention.

FIG. 3 is a sequence of graphs illustrating the operation and effect of the invention, according to one embodiment. "b)" in FIG. 3 depicts the event control signal $\overline{A}[t]$ for the corresponding audio signal of "a)" in FIG. 3, with the half-decay time of the smoother set to 250 ms. The audio signal contains three bursts of dialog, interspersed with quiet background campfire crackling sounds. The event control signal shows many auditory events in both the dialog and the background sounds.

In FIG. 3, "c)" shows the DRC gain signal where the event control signal $\overline{A}[t]$ is used to vary the release time constant for the DRC gain smoothing. As Crocket and Seefeldt describes, when the control signal is equal to one, the release smoothing coefficient is unaffected, and the smoothed gain changes according to the value of the time constant. When the control signal is equal to zero, the smoothed gain is prevented from changing. When the control signal is between zero and one, the smoothed gain is allowed to change—but at a reduced rate in proportion to the control signal.

In "c" of FIG. 3, the DRC gain rises during the quiet background sounds due to the number of events detected in the background. The resulting DRC-modified audio signal in "d)" of FIG. 3 has audible and undesirable swelling of the background noise between the bursts of dialog.

To reduce the gain change during quiet background sounds, an embodiment of the invention modifies or weights the auditory strength A[t] using a measure of the asymmetry of the audio signal spectrum. An embodiment of the invention calculates the spectral skewness of the excitation of the audio signal.

Skewness is a statistical measure of the asymmetry of a probability distribution. A distribution symmetrical about the mean has zero skew. A distribution with its bulk or mass concentrated above the mean and with a long tail tending lower than the mean has a negative skew. A distribution concentrated below the mean and with a long tail tending higher than the mean has a positive skew. The magnitude or power spectrum of a typical audio signal has positive skew. That is, the bulk of the energy in the spectrum is concentrated lower in the spectrum, and the spectrum has a long tail toward the upper part of the spectrum.

Figure 2:
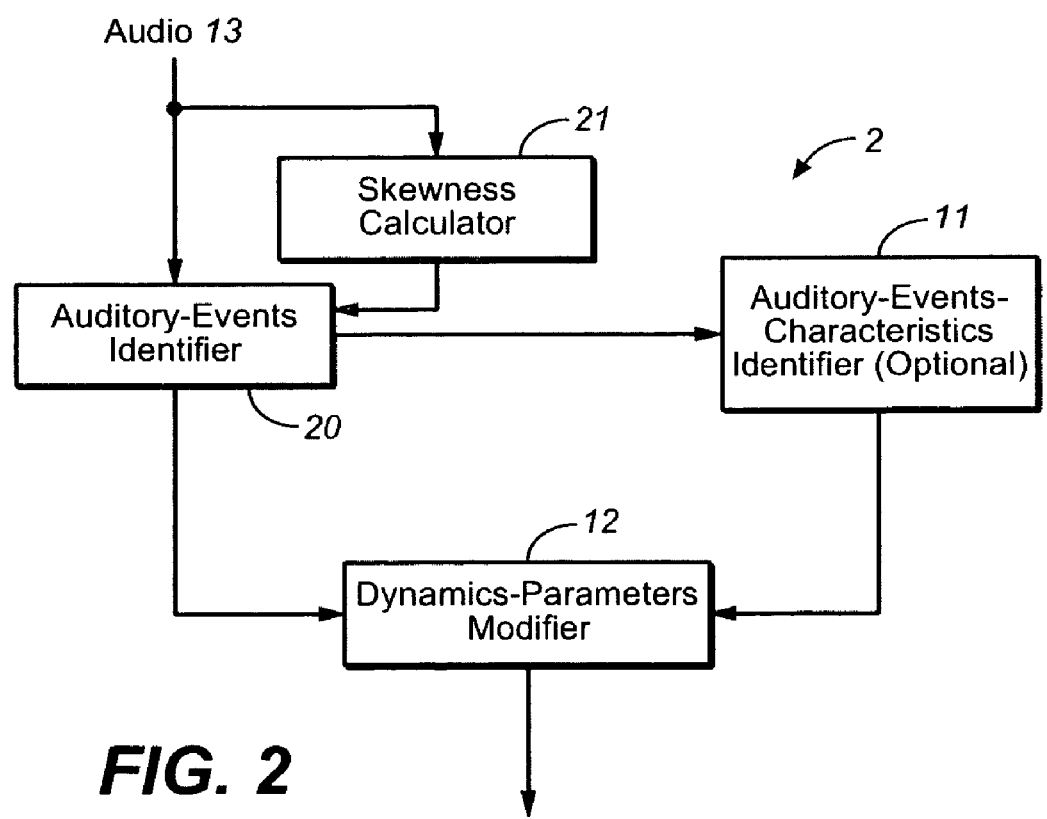
FIG. 2 illustrates an audio processor for identifying auditory events and calculating skewness for modify the auditory events, themselves for modifying the dynamics-processing parameters, according to an embodiment of the invention.

FIG. 2 illustrates an audio processor 2 according to an embodiment of the invention. The audio processor 2 includes the dynamics-parameters modifier 12 and the optional auditory-events-characteristics identifier 11 of FIG. 1, as well as an auditory-events identifier 20 and a skewness calculator 21. The skewness calculator 21 and auditory-events identifier 20 both receive the audio signal 13, and the skewness calculator 21 produces input for the auditory-events identifier 20. The auditory-events identifier 20, auditory-events-characteristics identifier 11 and dynamics-parameters modifier 12 are otherwise connected as are their counterparts in FIG. 1. In FIG. 2, the skewness calculator 21 calculates the skewness from a spectral representation of the audio signal 13, and the auditory-events identifier 20 calculates the auditory scene analysis from the same spectral representation. The audio signal 13 may be grouped into 50 percent overlapping blocks of M samples, and the Discrete Fourier Transform may be computed as follows:

$$X[k, t] = \sum_{n=0}^{M-1} x[n, t] e^{-j\frac{2\pi kn}{M}} \quad (3)$$

where M=2*N samples and x[n,t] denotes a block of samples.

The block size for the transform is assumed to be the same as that for calculating the auditory event signal. This need not be the case, however. Where different block rates exist, signals on one block rate may be interpolated or rate converted onto the same timescale as signals on the other block rate.

The excitation signal E[b,t] approximating the distribution of energy along the basilar membrane of the inner ear at critical band b during time block t is computed.

$$E[b, t] = \sum_k |T[k]|^2 |C_b[k]|^2 |X[k, t]|^2 \quad (4)$$

where T[k] represents the frequency response of a filter simulating the transmission of audio through the outer and middle ear and $C_b[k]$ represents the frequency response of the basilar membrane at a location corresponding to critical band b.

Figure 4:
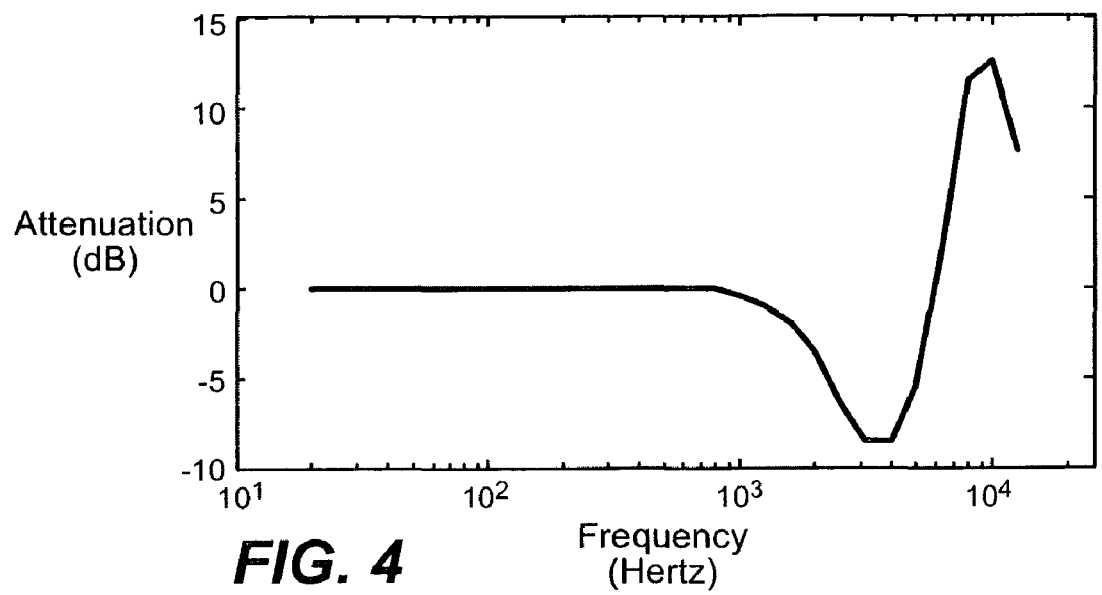
FIG. 4 is an idealized characteristic response of a linear filter suitable as a transmission filter according to an embodiment of the invention.
Figure 5:
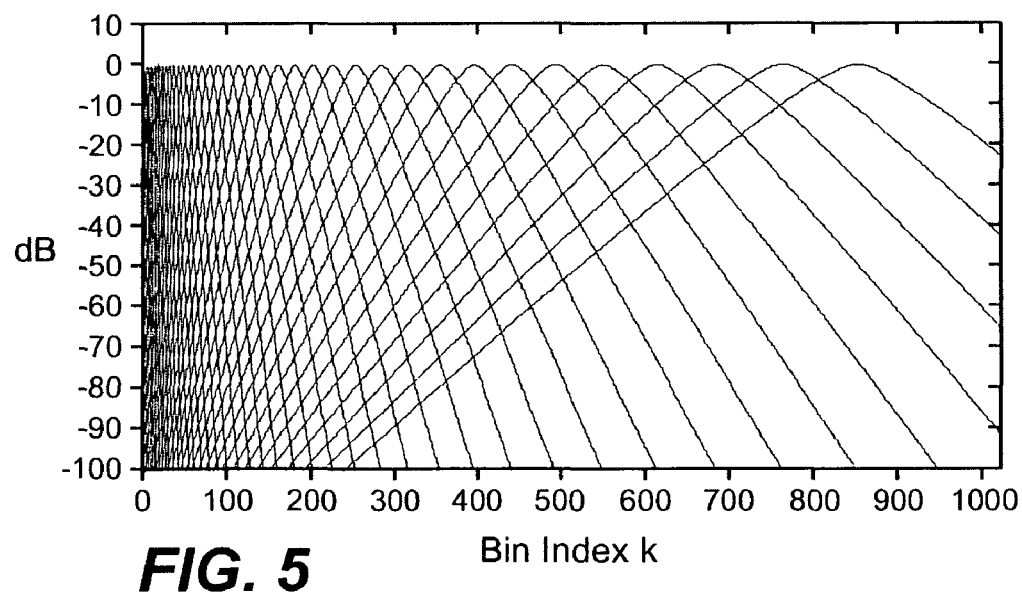
FIG. 5 shows a set of idealized auditory-filter characteristic responses that approximate critical banding on the ERB scale.

FIG. 4 depicts the frequency response of a suitable transmission filter T[k]. FIG. 5 depicts a suitable set of critical band filter responses, corresponding to $C_b[k]$, in which 40 bands are spaced uniformly along the Moore and Glasberg Equivalent Rectangular Bandwidth (ERB) scale, for a sample rate of 48 kHz and transform size of M=2048. A rounded exponential function describes each filter shape, and 1 ERB separates the bands.

If the auditory event boundaries are computed from the specific loudness spectrum, per Crocket and Seefeldt, then the excitation signal E[b,t] already exists as part of the specific-loudness calculation.

Finally the spectral skewness is computed from the excitation signal E[b,t] as:

$$SK[t] = \frac{1}{B-1} \frac{\sum_{b=0}^{B-1}(E[b,t]-\mu)^3}{\sigma^3} \quad (5)$$

where μ is the arithmetic mean of the excitation:

$$\mu = \frac{1}{B}\sum_{b=0}^{B-1} E[b,t] \quad (6)$$

and σ is the variance of the excitation signal:

$$\sigma = \sqrt{\frac{1}{B}\sum_{b=0}^{B-1}(E[b,t]-\mu)^2} \quad (7)$$

The skewness signal SK[t] of equation (5) fluctuates considerably and requires smoothing for it to avoid artifacts when modifying the event control signal and subsequent dynamics processing parameters. One embodiment uses a single pole smoother with a decay constant $\alpha_{SK}$ having a half-decay time of approximately 6.5 ms:

$$SK'[t] = \alpha_{SK} SK'[t-1] + (1-\alpha_{SK})SK[t] \quad (8)$$

Limiting the skewness to maximum and minimum $SK_{max}$ and $SK_{min}$, respectively, may be useful. A constrained skewness SK''[t] may be computed as:

$$SK''[t] = \begin{cases} 0 & SK'[t] \leq SK_{min} \\ \dfrac{SK'[t]-SK_{min}}{SK_{max}-SK_{min}} & SK_{min} < SK'[t] < SK_{max} \\ 1 & SK'[t] \geq SK_{max} \end{cases} \quad (7)$$

Low values (values close to 0.0) of the skewness signal SK''[t] typically correspond to characteristically quieter signals, while high skewness values (values close to 1.0) typically correspond to characteristically louder signals. In FIG. 3, the "e)" graph shows the skewness signal that corresponds to the audio signal in "a)" of FIG. 3. The skewness is high for the louder dialog bursts and low for the background sounds.

The skewness signal SK''[t] passes to the auditory-events identifier 20 of FIG. 2 that weights the spectral difference measure D[t] as:

$$D_{SK}[t] = SK''[t]D[t] \quad (8)$$

The skewness-modified auditory strength signal $A_{SK}[t]$ is computed in the same way as A[t] in equation (1):

$$A_{SK}[t] = \begin{cases} 0 & D_{SK}[t] \leq D_{min} \\ \dfrac{D_{SK}[t]-D_{min}}{D_{max}-D_{min}} & D_{min} < D_{SK}[t] < D_{max} \\ 1 & D_{SK}[t] \geq D_{max} \end{cases} \quad (9)$$

The skewness-modified auditory strength signal $A_{SK}[t]$ is smoothed in the same way as A[t] in equation (2):

$$\overline{A}_{SK}[t] = \begin{cases} A[t] & A_{SK}[t] > \alpha_{event}\overline{A}_{SK}[t-1] \\ \alpha_{event}\overline{A}_{SK}[t-1] & \text{otherwise} \end{cases} \quad (10)$$

In FIG. 3, "f)" depicts the skewness-modified event control signal $\overline{A}_{SK}[t]$ for the corresponding audio signal in "a)" of FIG. 3. Fewer auditory events appear during the background sounds while events corresponding to the louder dialog remain.

In FIG. 3, "g)" shows the skewness-modified event-controlled DRC signal. With fewer auditory events in the background sounds, the DRC gain stays relatively constant and moves only for the louder dialog sections. "h)" in FIG. 3 shows the resulting DRC-modified audio signal.

The DRC-modified audio signal has none of the undesirable swelling in level during the background sounds.

The skewness signal SK''[t] goes low sometimes for perceptually louder signals. For these loud signals, the value of spectral difference measure D[t] is large enough that even after weighting by the skewness signal SK''[t] in equation 8, the weighted spectral difference measure $D_{SK}[t]$ is typically still large enough to indicate an auditory event boundary. The event control signal $\overline{A}_{SK}[t]$ is not adversely affected.

The invention claimed is:

1. A method for controlling the loudness of auditory events in an audio signal for controlling gain changes in the audio signal in an automatic gain control or dynamic range control signal processing, comprising dividing said audio signal into auditory events, each tending to be perceived as separate and distinct, by detecting changes in spectral composition with respect to time, said dividing including detecting the location and strength of auditory event boundaries in said audio signal, obtaining a dynamically-changing measure of the spectral skewness of said audio signal, wherein spectral skewness is a statistical measure of the asymmetry of the probability distribution of the audio signal spectrum, modifying the strength of auditory event boundaries in response to said measure, such that the less the spectrum is skewed at the location of an auditory event boundary, the more the strength of the auditory event boundary is reduced, and controlling the loudness of auditory events in response to the location and skewness-modified strength of said auditory event boundaries such that the reduction of the strength of the auditory event boundary reduces the gain change of the audio signal during quiet background sounds.

2. A method according to claim 1 wherein dividing said audio signal into auditory events includes analyzing the spectrum of the audio signal.

3. A method according to claim 2 wherein obtaining a dynamically-changing measure of the spectral skewness of the audio signal includes calculating the skewness from a spectral representation of the audio signal.

4. A method according to claim 3 wherein calculating the skewness includes calculating an excitation signal approximating the distribution of energy along the basilar membrane of the inner ear.

5. A method according to claim 1 wherein dividing said audio signal into auditory events includes transforming the audio signal into a perceptual-loudness domain, said transforming including calculating an excitation signal approximating the distribution of energy along the basilar membrane of the inner ear.

6. A method according to claim 5 wherein obtaining a dynamically-changing measure of the spectral skewness of the audio signal includes calculating the skewness from said excitation signal.

7. A method according to claim 1 wherein said measure of the spectral skewness is a smoothed measure.

8. A non-transitory computer-readable memory containing a computer program for performing the method of claim 1.

9. A computer system comprising:
a CPU;
the memory of claim 8; and
a bus communicatively coupling the CPU and the memory.

10. Apparatus comprising means adapted to perform the method of claim 1.

* * * * *